US008231948B2

(12) United States Patent
Sawyer et al.

(10) Patent No.: US 8,231,948 B2
(45) Date of Patent: Jul. 31, 2012

(54) MICRO-MOLDED INTEGRAL NON-LINE-OF SIGHT ARTICLES AND METHOD

(75) Inventors: Wallace Gregory Sawyer, Gainsville, FL (US); Tony L. Schmitz, Gainsville, FL (US); John C. Ziegert, Gainsville, FL (US); Jeffrey Alan Bardt, Gainsville, FL (US); Gerald R. Bourne, Gainsville, FL (US)

(73) Assignee: The University of Florida Research Foundation, Inc., Gainesville, FL (US)

( * ) Notice: Subject to any disclaimer, the term of this patent is extended or adjusted under 35 U.S.C. 154(b) by 871 days.

(21) Appl. No.: 12/063,959

(22) PCT Filed: Aug. 15, 2006

(86) PCT No.: PCT/US2006/031984
§ 371 (c)(1),
(2), (4) Date: Feb. 15, 2008

(87) PCT Pub. No.: WO2007/022267
PCT Pub. Date: Feb. 22, 2007

(65) Prior Publication Data
US 2008/0193781 A1 Aug. 14, 2008

Related U.S. Application Data

(60) Provisional application No. 60/708,233, filed on Aug. 15, 2005, provisional application No. 60/794,955, filed on Apr. 26, 2006.

(51) Int. Cl.
*B32B 1/02* (2006.01)
*B23B 23/00* (2006.01)

(52) U.S. Cl. ............... 428/34.1; 428/35.7; 428/35.9; 428/36.9; 428/457

(58) Field of Classification Search ............... 428/34.1, 428/35.7, 35.9, 36.9, 457
See application file for complete search history.

(56) References Cited

U.S. PATENT DOCUMENTS
4,175,610 A * 11/1979 Zauhar et al. ............ 164/122.2
(Continued)

FOREIGN PATENT DOCUMENTS
WO 2003095708 A2 11/2003
(Continued)

OTHER PUBLICATIONS
Cohen et al., EFAB: rapid, low-cost desktop micomachining of high aspect ratio true 3-D MEMS, Micro Electro Mechanical Systems, 12$^{th}$ IEEE Int'l Conf., Orlando, FL, Jan. 17-21, 1999, pp. 244-251.
(Continued)

*Primary Examiner* — Marc Patterson
(74) *Attorney, Agent, or Firm* — Thomas, Kayden, Horstemeyer & Risley, LLP

(57) ABSTRACT

A method of forming integral articles having non-line-of-site contours includes the steps of providing a plurality of molds, the molds having at least one mold channel therethrough. The plurality of molds are stacked on one another to form a mold stack, wherein at least one portion of the mold stack provides a non-line of sight multi-level channel through at least partial overlap of the mold channels between adjacent ones of the plurality of molds. A flowable material is applied to the mold stack. The flowable material is pressed to fill the mold channels in each of the plurality of molds to form an integral article comprising a plurality of stacked integrally connected levels of the material, wherein through interconnection of the integrally connected levels the integral article provides at least one non-line of sight contour traversing in its thickness direction. The mold stack is then separated or removed to free the integral article.

11 Claims, 9 Drawing Sheets

U.S. PATENT DOCUMENTS

| | | | |
|---|---|---|---|
| 5,288,344 A | 2/1994 | Peker et al. | |
| 5,304,517 A * | 4/1994 | Casey et al. | 501/32 |
| 5,368,659 A | 11/1994 | Peker et al. | |
| 5,900,350 A * | 5/1999 | Provost et al. | 430/325 |
| 6,027,630 A | 2/2000 | Cohen | |
| 6,242,163 B1 | 6/2001 | Stampfl et al. | |
| 6,764,924 B2 * | 7/2004 | Gmur | 438/455 |
| 6,899,838 B2 | 5/2005 | Lastovich | |

FOREIGN PATENT DOCUMENTS

| | | |
|---|---|---|
| WO | WO 03/095708 | 11/2003 |

OTHER PUBLICATIONS

The International Search Report and Written Opinion dated Feb. 20, 2007.

Cohen, et al., "EFAB: Rapid, Low-Cost Desktop Micromachining of High Aspect Ratio True 3-D MEMS," Micro Electro Mechanical Systems, 1999. MEMS '99. Twelfth IEEE International Conference, Jan. 17-21, 1999, pp. 244-251.

The International Preliminary Report on Patentability dated Feb. 28, 2008.

* cited by examiner

MICRO-MOLDED INTEGRAL NON-LINE-OF SIGHT ARTICLES AND METHOD

CROSS-REFERENCE TO RELATED APPLICATIONS

This application is a §371 national stage entry of International Application No. PCT/US2006/031984, filed Aug. 15, 2006, which claims priority to U.S. Provisional Patent Application No. 60/708,233, filed Aug. 15, 2005, and U.S. Provisional Application No. 60/794,955, filed Apr. 26, 2006, the disclosure of all of which is hereby incorporated by reference.

STATEMENT REGARDING FEDERALLY SPONSORED RESEARCH OR DEVELOPMENT

This invention was made with government support under Contract No.: DMI0245589 awarded by the National Science Foundation. The government has certain rights in the invention.

FIELD OF THE INVENTION

The invention relates to integral generally amorphous articles and methods of forming the same, where the articles include non-line-of-sight contours traversing in a thickness direction of the article.

BACKGROUND

A large portion of the metallic alloys presently in use are processed by solidification casting, at least initially. The metallic alloy is melted and cast into a metal or ceramic mold, where it solidifies. The mold is stripped away, and the cast metallic article is ready for use or for further processing.

Micro-molding is known for producing various articles having microscale features. For example, U.S. Pat. No. 6,899,838 to Lastovich entitled "Method of forming a mold and molding a micro-device" discloses a method of forming a device including a plurality of micron or sub-micron sized features. A master having a surface contour defining a plurality of features is provided. The surface contour of the master is coated with at least one layer of material to form a shell. The master is removed from the shell to form a negative image of the surface contour in the shell. The negative image in the shell is filled with a material, for example, polycarbonate, polyacrylic, or polystyrene, to form a device having features substantially the same as the master. The negative image may be filled using injection molding, compression molding, embossing or any other compatible technique. Although Lastovich discloses a useful process and related articles for certain applications, the method disclosed is only capable of providing line-of-sight molded articles. What is needed is a low cost method of forming integral articles having non-line-of-site contours.

SUMMARY

A method of forming integral articles having non-line-of-site contours comprises the steps of providing a plurality of molds, the molds having at least one mold channel therethrough. The plurality of molds are stacked on one another to form a mold stack, wherein at least one portion of the mold stack provides a non-line of sight multi-level channel through at least partial overlap of the mold channels between adjacent ones of the plurality of molds. A flowable material is applied to the mold stack. The flowable material is pressed to fill the mold channels in each of the plurality of molds to form an integral article comprising a plurality of stacked integrally connected levels of the material, wherein through interconnection of the integrally connected levels the integral article provides at least one non-line of sight contour traversing in its thickness direction. The mold stack is then separated or removed to free the integral article.

The flowable material is generally heated above an ambient temperature prior to the pressing step and cooled prior to the separating or removing step. The flowable material is preferably an amorphous glass, such as a metallic glass. Each of the plurality of molds generally have at least one registration feature. In other embodiments, the moldable material can comprise a polymer or a magnetic material. The molds can comprise silicon wafers, or portions thereof. The method can include the step of forming the mold channels using reactive ion etching (RIE). A thickness of each of the plurality of molds can be from 20 to 150 μm. Each of the plurality of levels of the integral article can have a substantially planar top and bottom surface.

An integral article comprises a plurality of stacked integrally connected levels, each of the plurality of levels have a substantially planar top and bottom surface portions, wherein through interconnection via the integrally connected levels the integral article provides at least one non-line of sight feature traversing in its thickness direction between respective levels. The non-line of sight feature can be an internal feature in at least one of the plurality of levels.

The integral article can comprise an amorphous glass, such as a metallic glass. The integral article includes an outer layer material which comprises the metallic glass and a semiconducting material, such as silicon.

BRIEF DESCRIPTION OF THE DRAWINGS

A fuller understanding of the present invention and the features and benefits thereof will be obtained upon review of the following detailed description together with the accompanying drawings, in which:

FIG. 7A shows a side and a top view of a mold stack used to form micro-molded closed channels, while

DETAILED DESCRIPTION OF THE INVENTION

Figure 1:
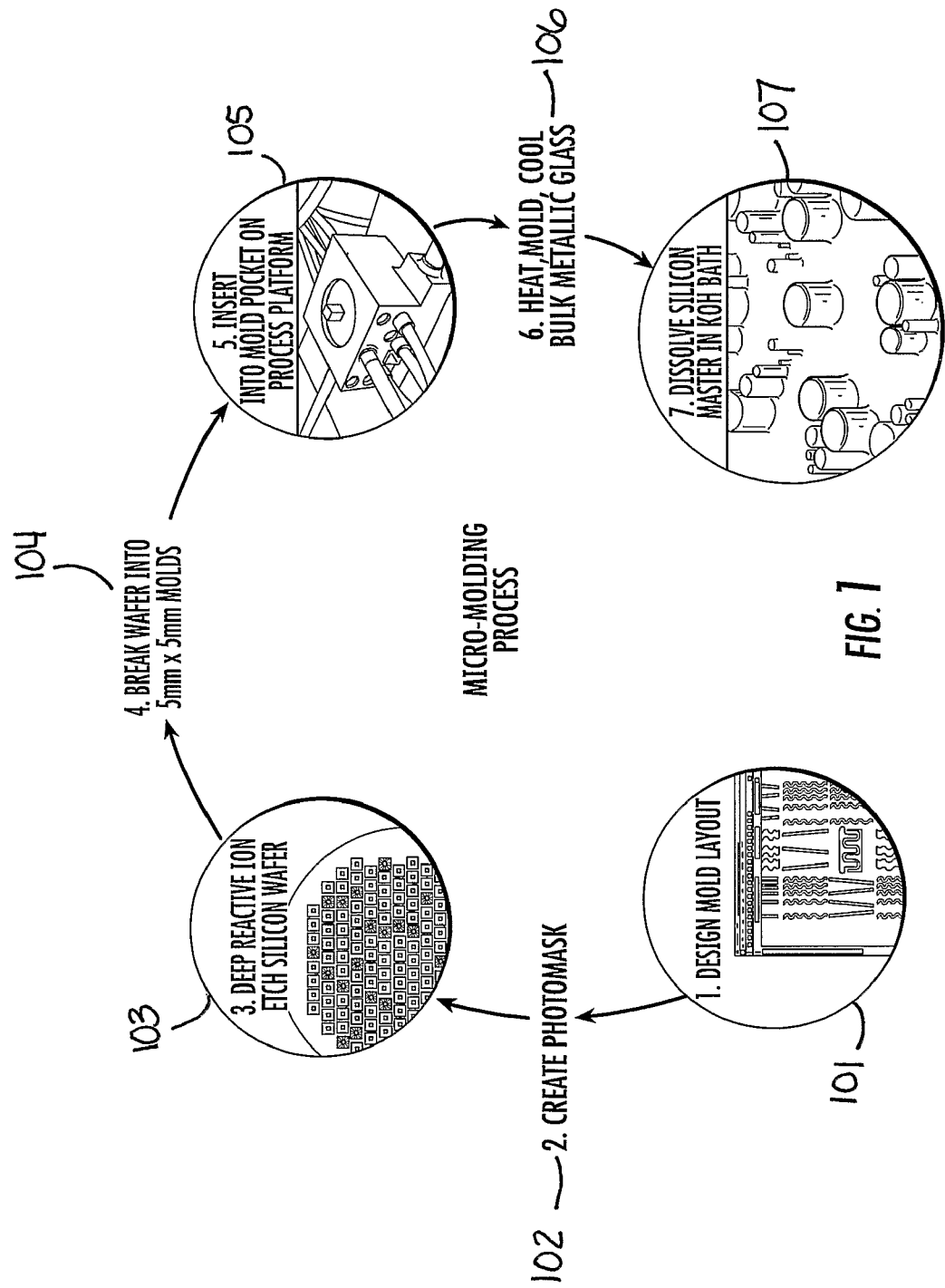
FIG. 1 shows a series of steps comprising an exemplary micro-molding process according to an embodiment of the invention.

A method of forming integral articles having non-line-of-site contours comprises the step of providing a plurality of molds. The molds have at least one mold channel reaching completely through their thickness. The plurality of molds are stacked on one another to form a mold stack. At least one portion of the mold stack provides a non-line of sight multi-level channel through at least a partial overlap of the mold channels between adjacent molds. A flowable material is applied to the mold stack. In most cases, the material is heated to provide the desired level of flowability.

The invention is not limited to a single stack of mold layers nor the application of the flowable material on a single side of the mold(s). In embodiments actually practiced, a single thin slice of flowable amorphous material is placed on top of a single silicon mold stack and is forced to flow through it. However, for some geometries to be molded, it may be desirable to use more than one piece of flowable material in a number of possible configurations. For example, it may be desirable to use a single or multiple layer mold stack with flowable material both on top and below it. Alternatively, slices of flowable material can be interleaved with the mold layers, or two layers of mold may be used with a single slice of flowable material between them. Non-line-of-sight molded articles can be achieved in all of these and related variants, including curved portions if desired.

The flowable material is than pressed to fill the mold channels in each of the plurality of molds to form an integral article comprising a plurality of stacked integrally connected levels of the material. In a preferred embodiment, the flowable material is heated prior to molding. In particular, using a material that does not experience a phase change upon cooling, such as metallic glass, the metallic glass or other material is preferably heated to a temperature above its glass transition temperature (Tg), such as to a temperature that is 20 to 50 degrees above its Tg, but below its melting temperature. Since metallic glass is a material that does not experience a phase change upon cooling, this method achieves a very low level of shrinkage and a high level of dimensional control. Also, the molding temperatures are substantially lower than in other metal casting processes, allowing the use of molds made of materials which could not be used with the high temperatures required to "melt" most metals.

Through interconnection of the integrally connected levels articles according to the invention provide at least one non-line of sight contour traversing in a thickness direction of the article. As used herein, the phrase "thickness direction" is defined as a direction perpendicular to the planar faces of the mold elements. Finally, the mold stack is separated or removed to free the integral article. Since the molds are generally highly planar, such as when using the preferred silicon wafer-based molds, the resulting levels of the articles generally have substantially planar top and bottom surfaces (See scanned SEM micrographs shown in FIGS. 5 and 6). This evidences the surprising and unexpected result that the molds seal with one another sufficiently during processing to prevent any detectable leakage of the flowable material into the region in between pressed together mold surfaces.

The article features providable by the invention are generally microscale, thus the method is generally referred to herein as micro-molding. In one embodiment, feature sizes range from 1 to 100 µm. However, features can be larger than microscale, and also smaller than microscale (nanoscale). The micro-molding of the preferred bulk amorphous materials according to the invention provides low cost fabrication of components, including complex-shaped components. Using the preferred metallic glass, the invention provides a method of forming high strength, high precision, and high aspect ratio components, using an inexpensive and facile process from master molds. Articles can include high aspect ratio features. Aspect ratios obtainable can be 20, or more.

Articles having non-line of sight contours traversing in a thickness direction of the article may be possible to form based on previously disclosed methods. However, such previous methods require several assembly steps involving bonding to connect the various component pieces to form such articles. In contrast, the invention provides a single molding step to form monolithic/unitary articles having non-line of sight contours traversing in a thickness direction of the article. Unlike articles made from previously disclosed methods, articles according to the invention are integral articles formed from a single uniform material, thus having no bonding layers. The non-line of sight feature traversing in a thickness direction of the article generally includes one or more internal features in at least one of the plurality of levels. "Internal features" are defined herein as features that are shaded by material at the periphery of the level such that a mechanical or laser beam (drill) cannot reach the same. As used herein, the phrase "integral articles" refers to one piece molded articles having uniform bulk properties throughout and thus no internal interfaces, such as welded, pressed, bolted, riveted, or bonded interfaces.

FIG. 1 shows a series of seven (7) steps comprising an exemplary micro-molding according to the invention. In step 101, a mold layout is designed, such as using computer aided design (CAD). In step 102, one or more photomasks are created based on the layout. Deep reactive ion etching (DRIE) in conjunction with a photolithographically defined pattern of photoresist or silicon oxide is preferably used to etch into a preferably highly planar substrate, such as a silicon wafer. DRIE is a high aspect ratio capable, deep trench silicon etching process. The principle of the deep trench silicon etching process is an alternating fluorine based etching and passivation of the structures. This results in sidewall profiles of 90°±1° with aspect ratios of up to 40:1.

Some resulting etched regions traverse the entire thickness of the Si wafer, generally being 100 to 300 µm. Following photoresist removal, in step 104, the wafer can be sectioned into a plurality molds, such 5 mm×5 mm molds. A given wafer can provide hundreds of molds, which can be different or the same mold pattern. The molds preferably have at least one feature for registration with one another, such as an alignment hole.

The plurality of molds are then stacked on one another with the aid of one or more alignment features, such as an alignment hole (e.g. together with a holding pin) or other registration structure, to form a mold stack. At least one portion of the mold stack provides a non-line of sight multi-level channel through at least partial overlap of the mold channels between adjacent molds. The molds stack and aligned using the alignment hole and are then inserted into a mold pocket on a process platform in step 105. In step 106 a flowable material, such as bulk metallic glass (BMG), is applied heated, or is placed then heated to become suitably flowable, and is then pressed into the molds, followed by a fairly rapid cooling process in the case of a metallic glass to limit crystal growth. Finally, in step 107, the stacked mold is preferably removed by dissolving the Si mold using a silicon etchant, such as KOH.

As noted above, the flowable material is preferably a BMG. BMGs are amorphous metallic alloys, commonly referred to metallic glasses, which are formed by solidification of alloy melts by cooling the alloy to a temperature below its glass transition temperature before appreciable nucleation and crystallization can occur. They do not have a crystalline structure, and accordingly have no grains and grain boundaries. It is the presence of the grains and grain boundaries that often limit the spatial resolution of replicas formed from conventional crystalline metallic materials. Additionally, the amorphous, rather than crystallographic structure leads to small changes in volume upon solidification which greatly reduces shrinkage (or changes in dimensions of the part relative to the desired mold size). Bulk-solidifying amorphous alloys such as metallic glasses are characterized by very smooth surfaces and a low coefficient of friction at their surfaces. Bulk-solidifying amorphous alloys have excellent mechanical and physical properties. They exhibit good strength, hardness, and wear resistance. They have good corrosion resistance as a result of the absence of grain boundaries.

Ordinary metals and alloys crystallize when cooled from the liquid phase. It has been found, however, that some metals and alloys can be undercooled and remain as an extremely viscous liquid phase or glass at ambient temperatures when cooled sufficiently rapidly. It is desirable that the cooling rate required to suppress crystallization be in the order of from 1 K/s to $10^3$ K/s or even less. Recently, alloys of zirconium and/or titanium, copper and/or nickel, other transition metals and beryllium have been found which form amorphous bodies of substantial thickness. Such alloy compositions are disclosed in U.S. Pat. Nos. 5,288,344 and 5,368,659.

However, the invention is in no way limited to metallic glass. Any flowable material may be used, such as many polymers which become readily flowable (above Tg) under modest heating. Polymers can be lubricious polymers, such as PTFE. The flowable material can also be a composite material, where only one component of the composite need be flowable to impart flowability to the composite. In one embodiment, powders are intermixed with a flowable material, such as graphitic powder ensembles. The powder can be a magnetic powder.

Articles according to the invention have been surprisingly found to evidence essentially complete filling of the mold channels when BMG has been used, even when the lateral flow distances have been large, or the mold surface is substantially uneven (e.g. scalloping from the DRIE etch used to form the mold feature). Lateral flow distances of up to 20 times the minimum channel cross-sectional dimension have been provided using the invention. Accordingly, for an exemplary channel that is 50 micrometers by 50 micrometers the lateral flow distance can be up to at least 1 millimeter.

It is believed that some chemical interaction takes place between the BMG and the Si mold during processing which permits the unexpected complete filling to occur, even for uneven (scalloped) mold surfaces. As a result, molded articles according to the invention may includes a unique and process specific outer layer material which comprises the metallic glass together with some of the mold material (e.g. Si).

Figure 2:
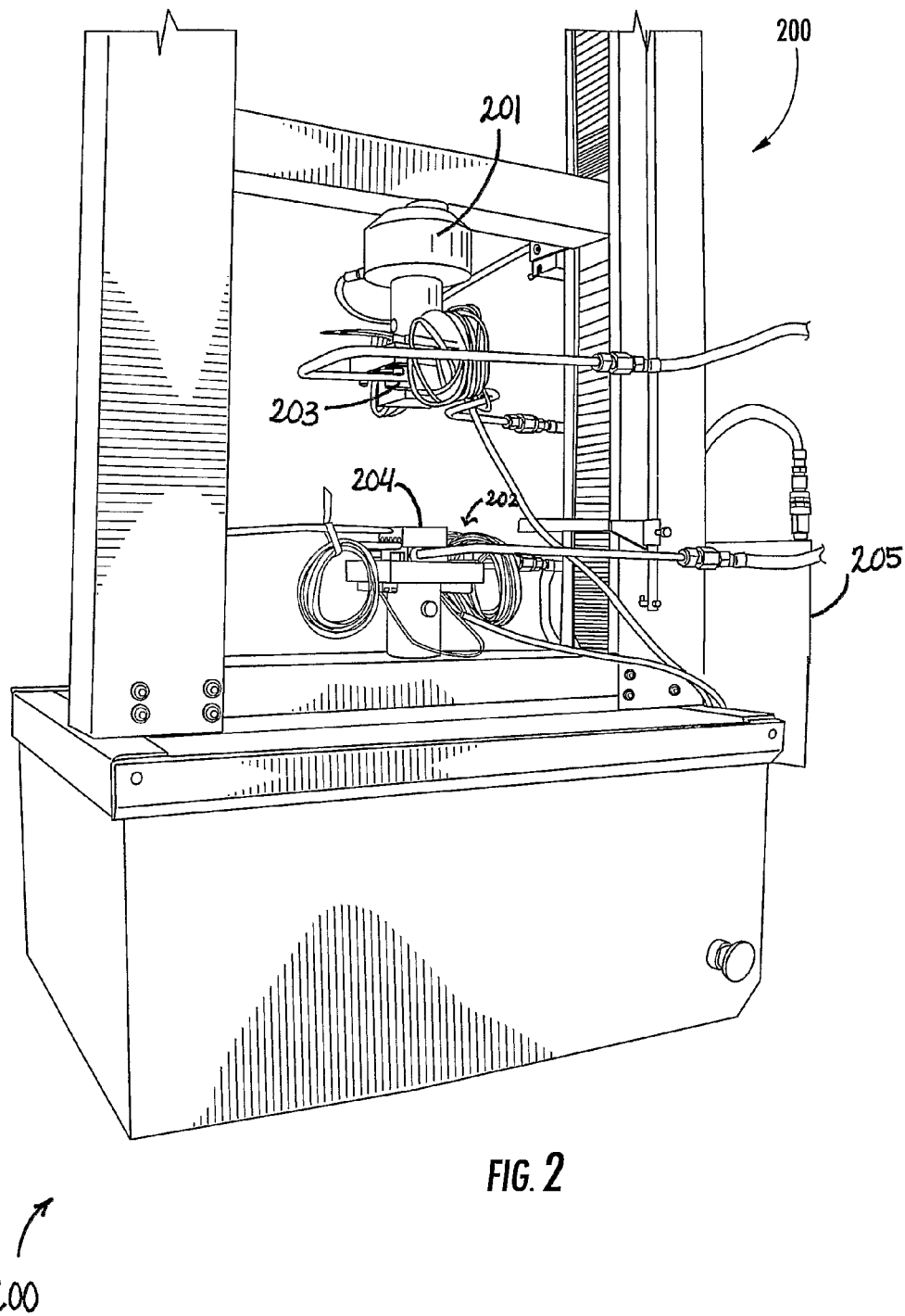
FIG. 2 shows a scanned image of an apparatus adapted for forming micro-molded integral articles according to the invention.

FIG. 2 shows an apparatus 200 according to the invention adapted for forming micro-molded integral articles. The apparatus includes a load cell 201, cartridge heaters 202, top platen 203, bottom platen 204 and water reservoir 205. Although cartridge heaters 202 were used because of ease of use and low price, numerous other heating methods are also possible including induction heating, microwave heating, and laser heating. The operating parameter for apparatus 200 are generally in the following ranges: force 0-5,000 N, pressure 0-200 MPa, temperature 25-600° C., and displacement 0 to 1 m. The apparatus 200 is capable of operating anywhere in the ranges of values described above. Most of the experiments performed used a force around 3000 N, giving a pressure of around 120 MPa, at a temperature of around 450° C. Displacement is typically very small during molding, less than 1 mm. However, a larger range of displacement of the crosshead (~200 mm) is generally required for loading and unloading samples.

Figure 3:
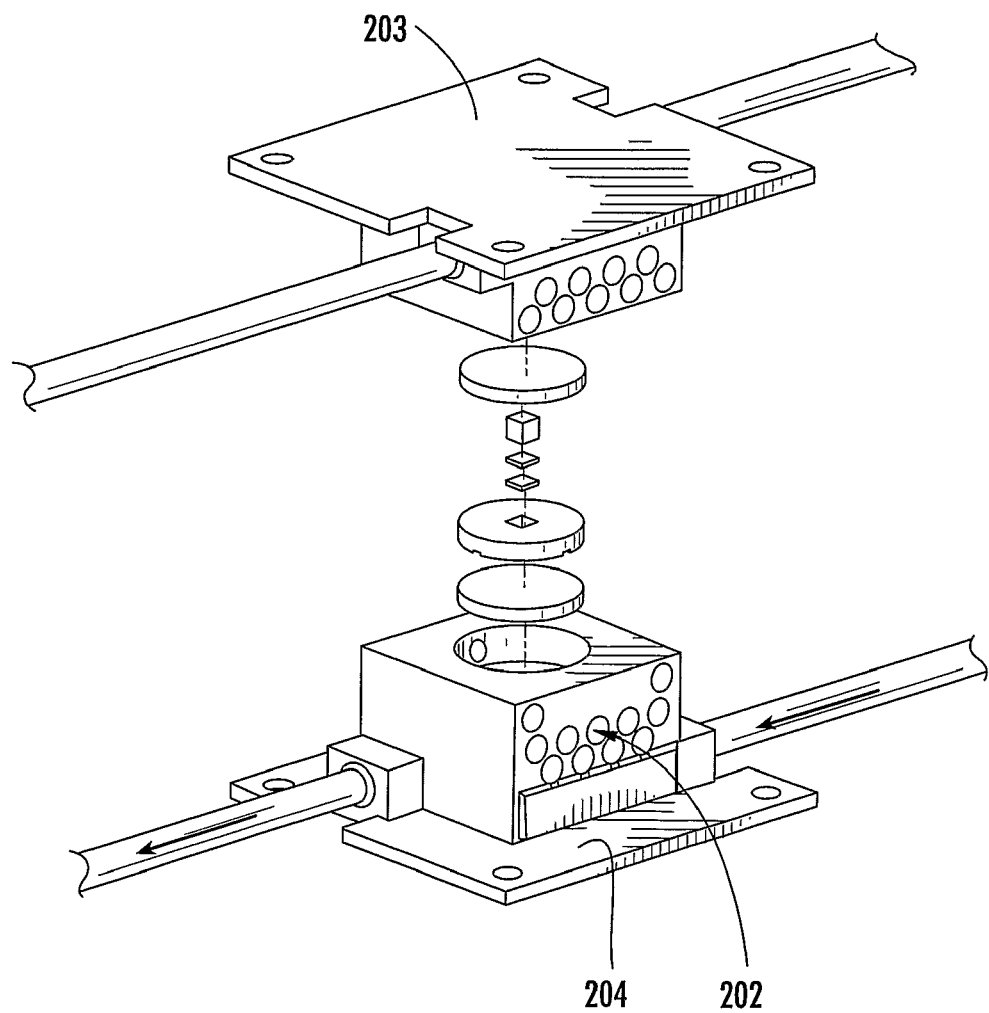
FIG. 3 shows a close up depiction of the load cell 201, cartridge heaters 202, top platen 203, and bottom platen 204 shown in FIG. 2.

FIG. 3 shows a close up depiction of cartridge heaters 202, top platen 203, and bottom platen 204. The square punch shown is for applying pressure.

Figure 4:
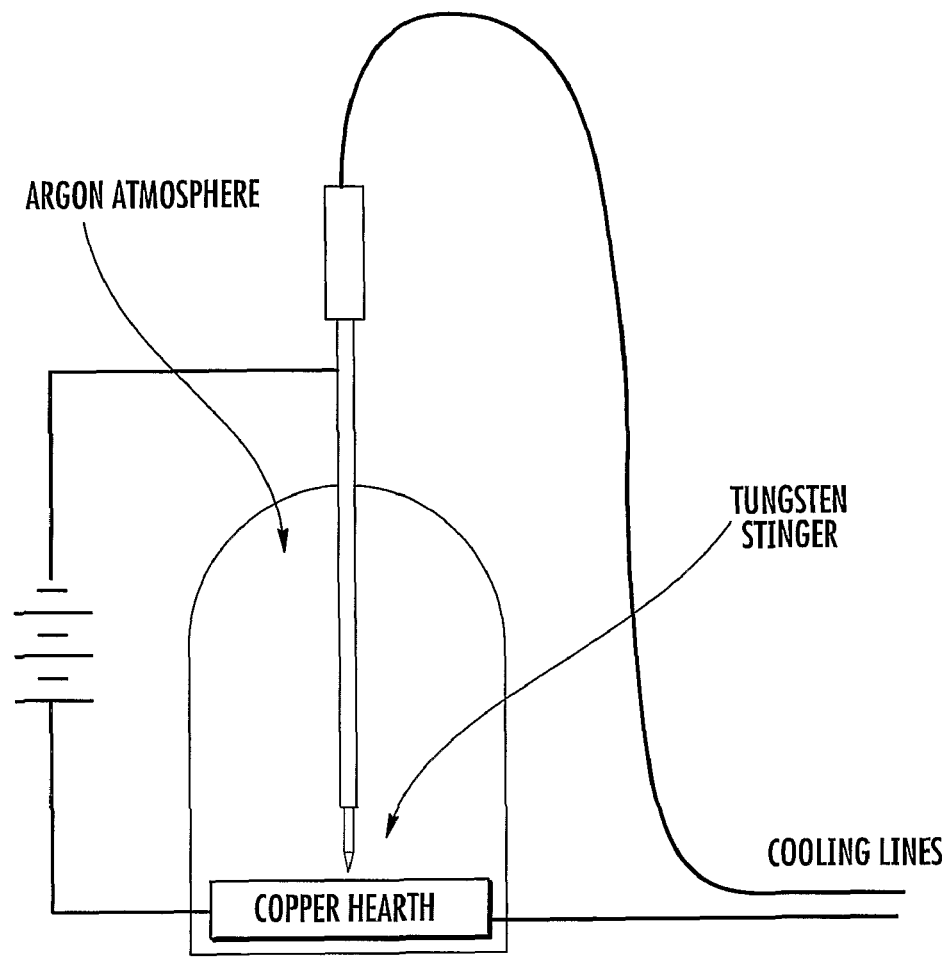
FIG. 4 shows preparation steps for the metallic glass including melting and cutting before insertion into a mold pocket disposed a silicon wafer-based mold stack.

As shown in FIG. 4, the as received metallic glass plates are preferably melted into buttons to remove porosity. Buttons are then preferably remelted in a drop quench square copper mold to obtain an amorphous structure. The structure is then cut using a diamond saw then polished and cleaned before insertion into a mold pocket disposed on a silicon wafer mold stack.

Following release, the integral articles can receive additional processing. For example, the periphery can be laser textured or micromilling can be applied to add features or otherwise change the overall geometry. Other additional exemplary processing can include mechanically trimming to size, polishing, lapping, and/or chemical etching.

Figure 7A:
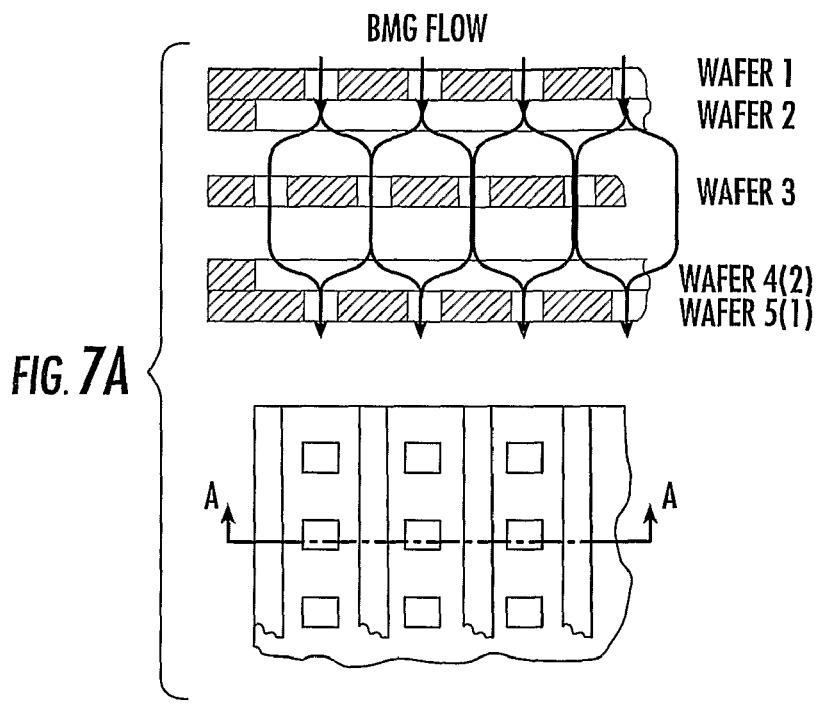
Figure 7B:
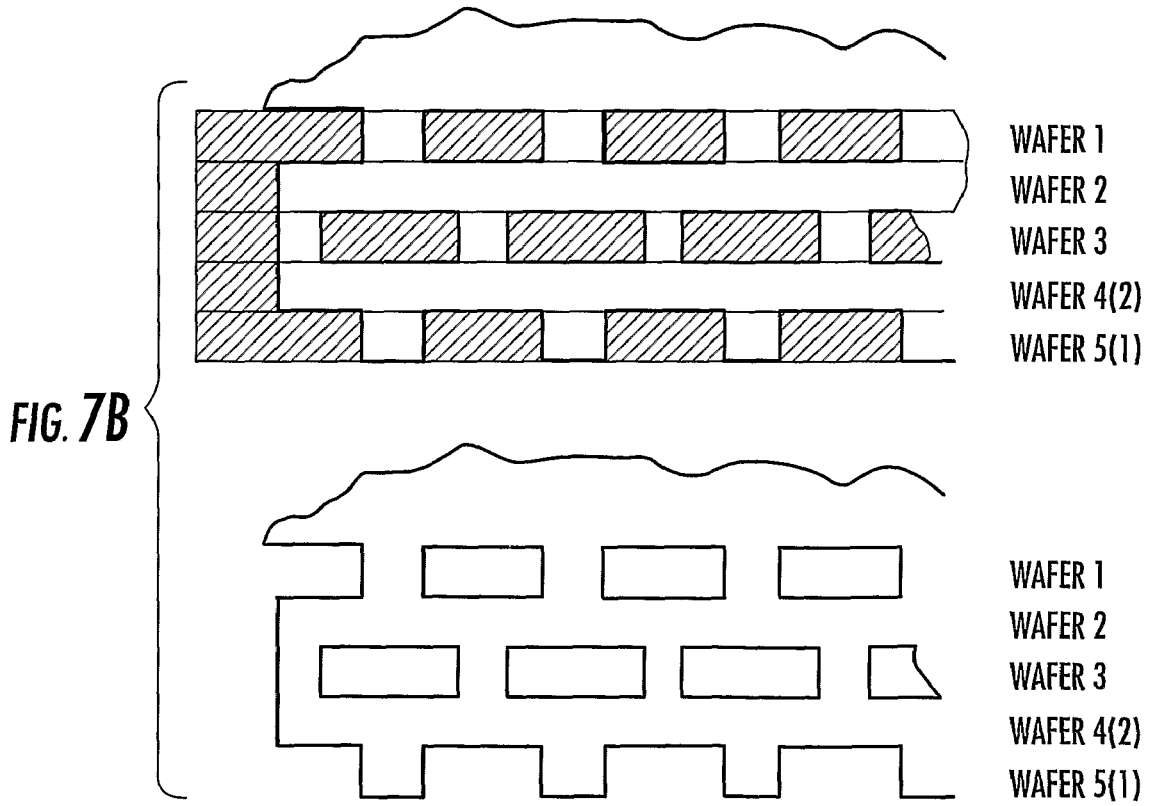
FIG. 7B shows a side view of the resulting molding component before and after removal of the silicon mold.

A method for forming micro-molded closed channels using the invention is now described. As with the other inventive embodiments, each mold component has at least one mold channel therethrough and an alignment feature, such as an alignment hole or other registration structure. In one embodiment, the mold stack can comprise at least a five layer (wafer) mold, where 1st (top-most) and 5th (bottom-most) wafers have identical patterns. However, there is no requirement for the first and fifth wafer to have identical patterns. The 2nd and 4th wafers simply provide a spacer (recess) on the periphery of the mold stack which gets filled with glass upon molding and thus provides the top and bottom for the closed channels. The second and fourth wafers can be patterned or unpatterned. The 3rd (center) mold provides a plurality of relatively long open features. The solid portions of the third mold following molding and subsequent etching form the desired closed microchannels, while the features once filled by the mold material provide the side-walls for the microchannels. FIGS. 7A and 7B described in the examples below describe a specific five wafer mold stack embodiment for forming micro-molded closed channels.

Micro-molded articles according to the invention have a broad range of expected applications. For example:

Optical Devices

The use of atomically flat wafers according to the invention will enable the production of reflective metallic surfaces without the requirement for secondary polishing operations. This capability can be used to fabricate flexible mirrors and multi-mirror arrays, free-form reflective optics, diffraction gratings, waveguides, tuned resonators, and the production of plastic injection molds directly from diamond turned aspheric lenses (depending on the relative glass transition temperatures). Fiber optic interconnects may also be made using the invention.

Thermal Systems

Rapid, low cost fabrication of micro-scale heat exchangers is an important capability in many areas. For example, the performance of many optical detectors is highly dependent on proper cooling. The attractiveness of micro-scale systems for thermal/chemical reactions is driven by the improved efficiencies obtained at small length scales. A variety of such systems can be fabricated using the invention, including those requiring complex geometries. Micro-thermo-fluidic components for heat exchangers can also be formed.

Fluidic Systems

Micro-fluidic systems have received substantial attention in the literature for a number of applications. For example, the use of the micro-molding process described herein to produce three-dimensional channel patterns in closed architectures is a key enabler for high throughput analysis. Additionally, micro-scale turbines, valves, and other fluidic system components, as well as micro-chemical reactors, may also be economically produced using the invention.

Electronics

One key component that could be realized using the invention is lowly damped solid oscillators. Also, because the processing temperature is generally relatively low, micro-molding could be applied as the final step in CMOS production, such as for sealing the circuit against outside contamination. Connector elements for very high frequency microwave circuits may also be made using the invention.

Mechanical Systems

Important mechanical system application areas for the invention include MEMS packaging; monolithic (seal-free) micro-scale pumps and compressors; fuel cell current collector plates with variable channel geometries for reduced pressure drop; new monolithic fuel injector designs for reduced emissions in diesel engines; and drug discovery applications that require rapid, accurate positioning relative to multi-well plates (multi-degree of freedom, monolithic flexures could be employed). A collection of basic components, such as rotary and linear joints, power transmission components, and couplings formed using the invention can be identified and used as the basic building blocks for micro-machines. Micro mechanical components can include gears, shafts, cams, and levers. Flexure pivot based micro-mechanisms for creating prescribed mechanical motions in one or more degrees of freedom can also be produced.

Other Applications

The invention may also prove valuable for solar applications. For example, the high surface area provided by articles according to the invention may provide high efficiency solar collectors. Surface areas can be 400 times the footprint of the article, or even higher. The high surface area aspect also allows articles according to the invention to provide high efficiency heat sinks, such as for semiconducting devices.

EXAMPLES

It should be understood that the examples described below are provided for illustrative purposes only and do not in any way define the scope of the invention.

Figure 5A:
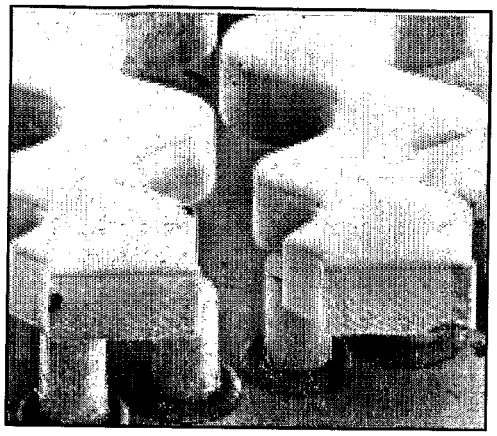
FIGS. 5A-C show scanned SEM images of two-level micro-molded integral articles according to the invention. Two stacked silicon wafer molds were used to form the mold stack.
Figure 5B:
Figure 5C:
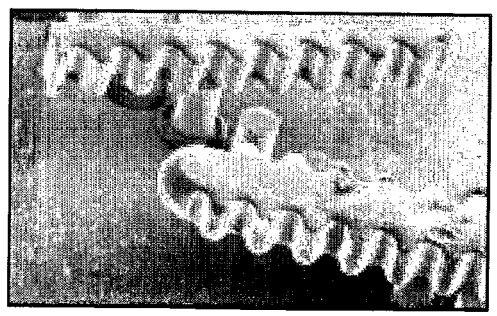
Figure 6A:
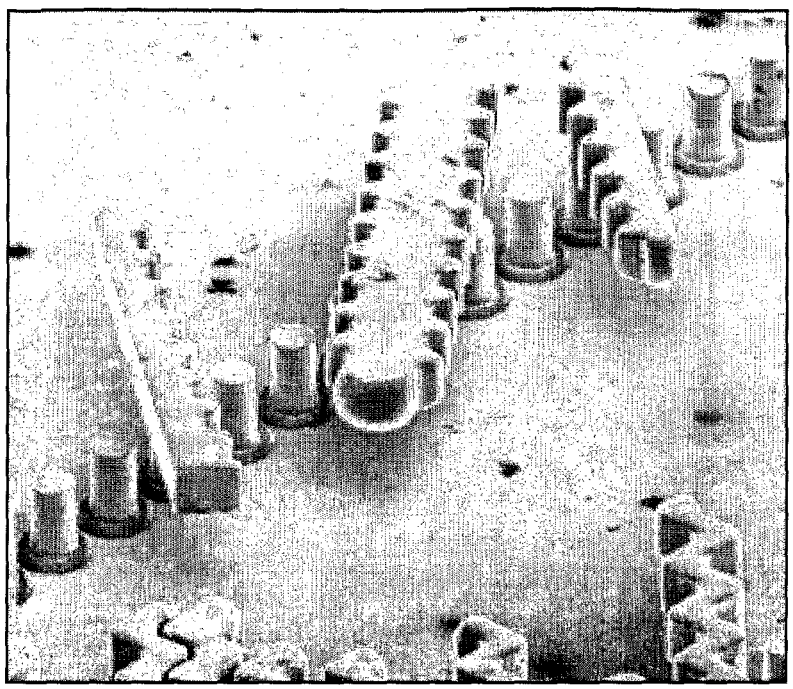
FIGS. 6A-D shows additional scanned SEM micrographs from the same example shown in FIGS. 5A-C.
Figure 6B:
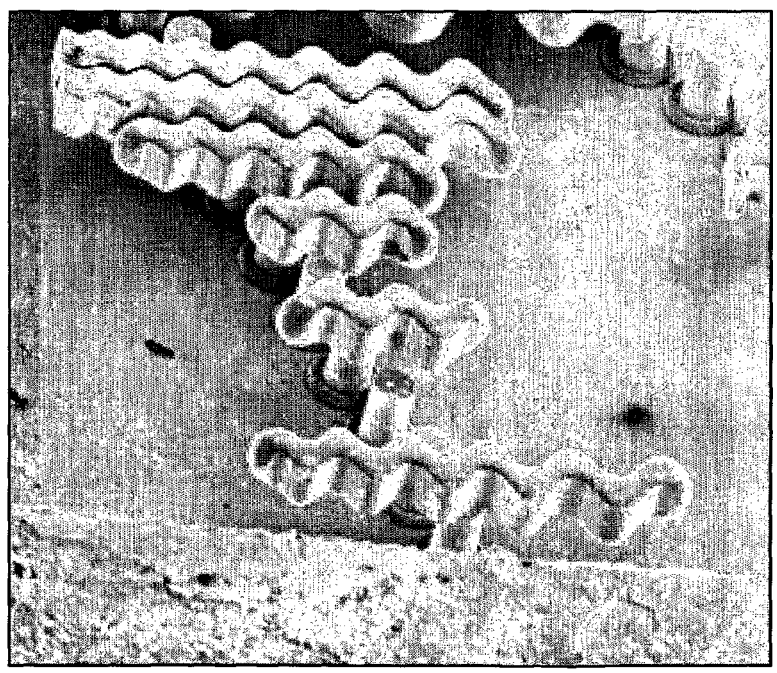
Figure 6C:
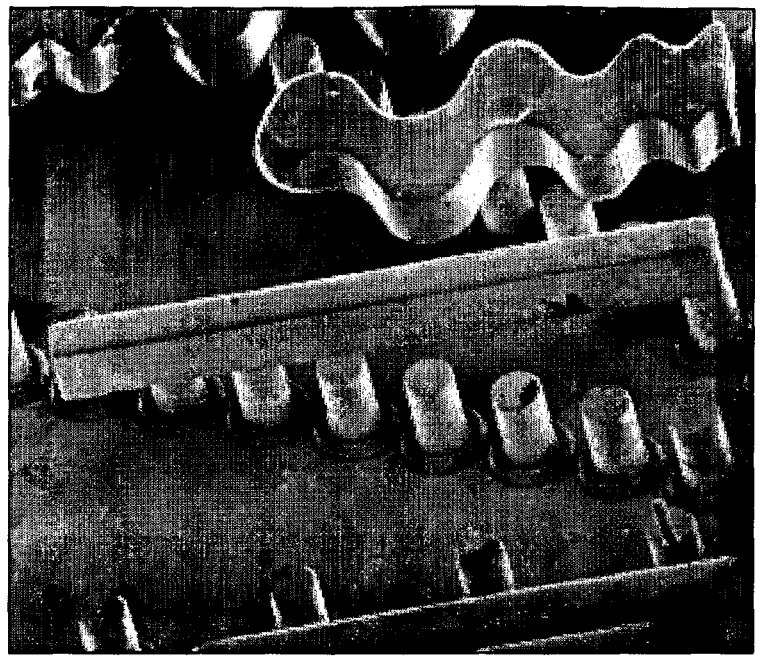
Figure 6D:
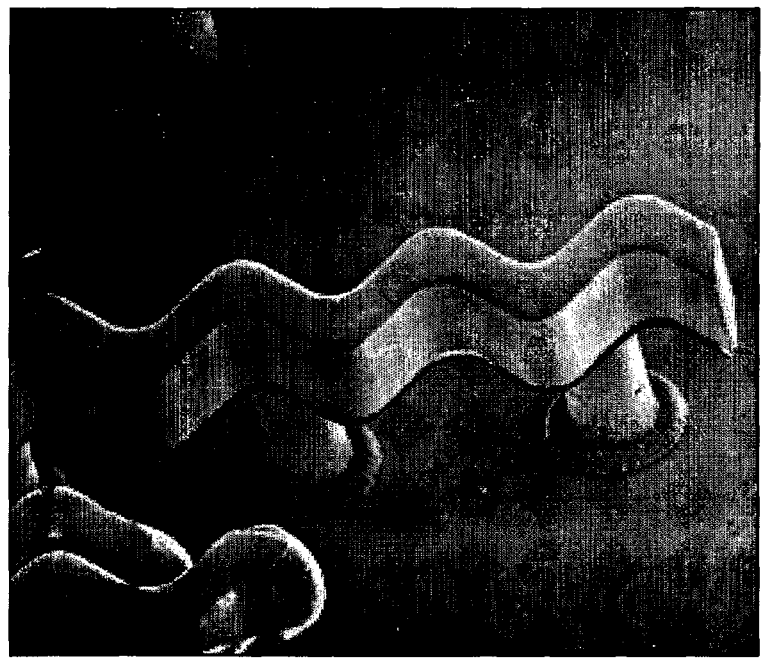

FIGS. 5A-C shows scanned SEM images of two-level micro-molded integral articles produced according to the invention. Two stacked silicon wafer molds were used to form the mold stack. The bottom mold had various straight and curved line channels, while the top mold had post features. Circular through holes provided registration between the molds. Metallic glass was placed above the mold stack and a square punch was inserted on top of the material and mold stack. During processing the metallic glass flowed through the top mold of posts into the bottom mold of various channel geometries. Conditions used were 450° C., 150 MPa of pressure for 60 seconds. The silicon wafer mold stack was then dissolved away with KOH to reveal the molded article. The substantially flat top and bottom surfaces of each level of the article are clearly shown. This evidences the surprising result that the molds sealed well to one another to an extent that prevented leakage of the flowable material into the region in between pressed adjacent mold surfaces during molding. FIGS. 6A-D shows additional scanned SEM micrographs for articles formed from the same example.

FIG. 7A shows a side and a top view of an exemplary five wafer mold stack used to form micro-molded closed channels, while FIG. 7B shows a side view of the resulting molding component before and after removal of the silicon mold. Referring to FIG. 7A, although a space is shown between wafers 2 and 3 and wafers 3 and 4, there is no need for such spaces. Although five wafer stack is shown, more than five wafers can be used to form more complex molded closed channels. Following registration and aligning together of the respective wafers using a suitable alignment structure, a flowable glass (shown as BMG) is forced through holes/channels cut in the wafers to travel from wafer 1 to wafer 5 (or from wafer 5 to wafer 1). Although the glass is shown having pointed regions, the pointed regions at the bottom are artifacts of the design and are not generally required. The top view shown in the bottom of FIG. 7A shows the holes in wafers 1 and 5 are identical and are aligned with one another.

Referring now to FIG. 7B, a side view taken along Section A-A of the bottom depiction in FIG. 7A after BMG molding is shown. Mold (silicon) regions are shown encapsulated by BMG and are labeled as "silicon captured inside mold". Following a post-molding selective silicon etch, the regions formerly identified as "silicon captured inside mold" each become micro-molded channels labeled as "closed channel regions". The silicon mold material can be removed in a variety of ways, such as using KOH in the case of silicon molds.

Figure 8:
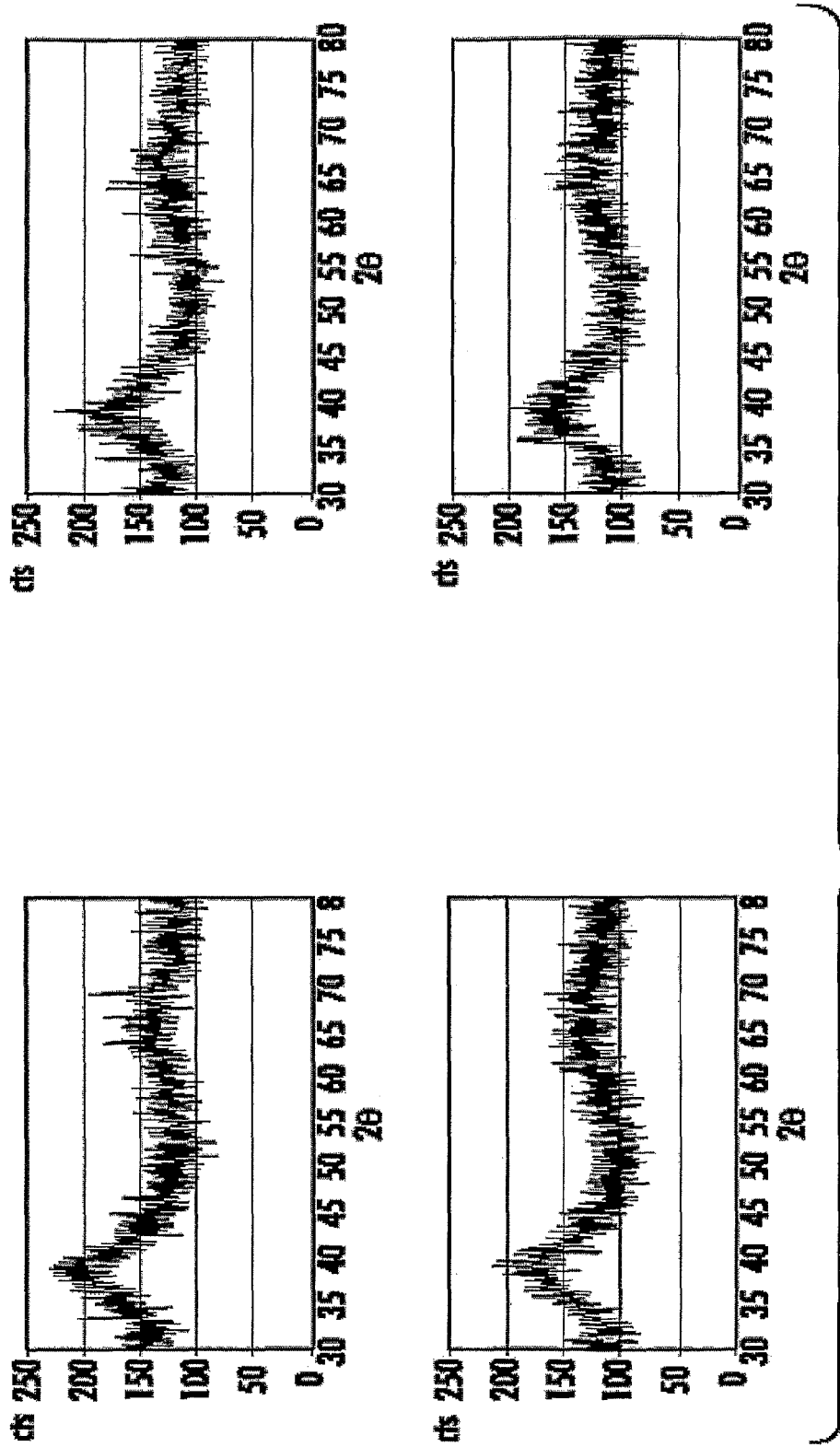
FIG. 8 shows results from X-ray diffraction performed on samples as described above. The broad diffuse peaks shown provide clear evidence that most of the material remains amorphous through the micro-molding process.

X-ray diffraction studies were performed on samples as described above as shown in FIG. 8. The broad diffuse peaks shown provide evidence that most of the material remains amorphous following the micro-molding process.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. An integral article, comprising:
a plurality of stacked integrally connected levels, each of the plurality of levels comprising a material that forms a one piece molded article without internal interfaces, where the material is solid at ambient temperature and is flowable when at a temperature above ambient, wherein through interconnection via the integrally connected levels of the integral article, the integral article includes at least one non-line of sight contour of the material traversing between the levels in a thickness direction.

2. The article of claim 1, wherein each of the plurality of levels has substantially planar top and bottom surface portions.

3. The article of claim 1, wherein the non-line of sight contour has a first portion in a first level that is completely offset from a second portion in a second level.

4. The article of claim 1, wherein the flowable material comprises an amorphous glass.

5. The article of claim 4, wherein the amorphous glass is a metallic glass.

6. The article of claim 5, further comprising an outer layer material that is a semiconductor.

7. An integral article formed by a process of:
providing a plurality of molds, wherein at least a portion of the molds have one or more mold channels therethrough;
stacking the plurality of molds on one another to form a mold stack, wherein the mold stack provides a non-line of sight channel through the at least a portion of the molds in a thickness direction, the non-line of sight channel being formed by partial overlap of the one or more mold channels between adjacent ones of the at least a portion of the molds;

applying a flowable material to the mold stack at a temperature above ambient and below the melting temperature of the material;

pressing the flowable material to fill the one or more mold channels to form the integral article;

solidifying the flowable material by cooling the flowable material to ambient temperature, the flowable material cooled at a rate to limit crystal growth in the solidifying material; and separating or removing the mold stack to free the integral article.

8. The integral article of claim 7, wherein the flowable material is an amorphous glass.

9. The integral article of claim 7, wherein the flowable material is applied to the mold stack at a temperature above the glass transition temperature of the material.

10. The integral article of claim 7, wherein the material does not experience a phase change upon cooling from the temperature above ambient to ambient temperature.

11. The article of claim 1, wherein the non-line of sight contour includes an internal feature in at least one of the plurality of levels, the material at a periphery of the at least one level preventing direct access to the internal feature.

* * * * *